Figure 1:
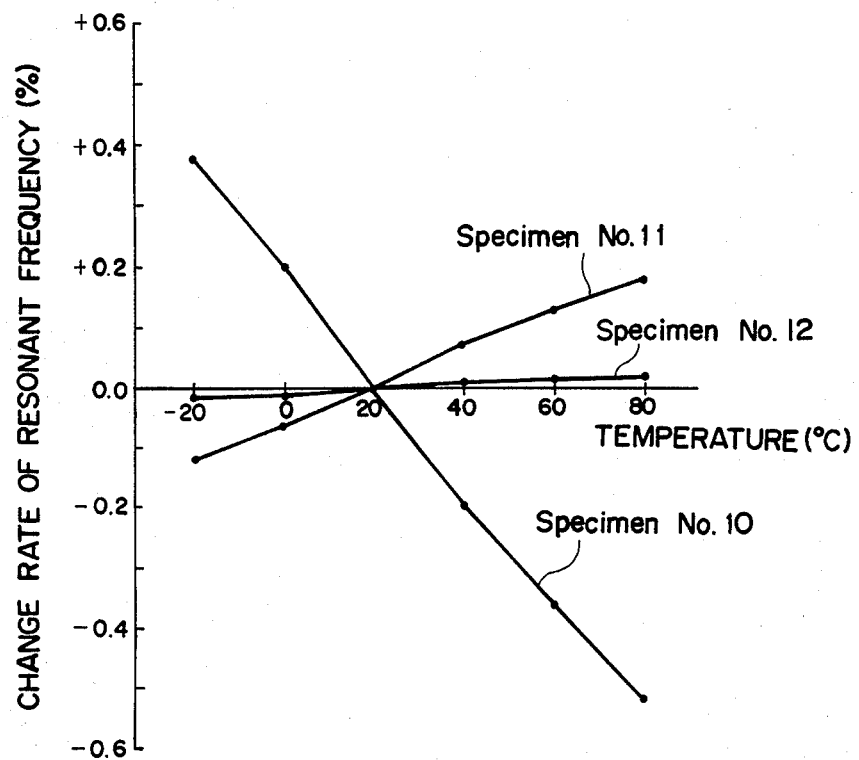

United States Patent [19]

Ogawa et al.

[11] Patent Number: 4,511,483
[45] Date of Patent: Apr. 16, 1985

[54] PIEZOELECTRIC CERAMIC COMPOSITIONS

[75] Inventors: Toshio Ogawa, Kyoto; Toshihiko Kittaka, Nagaokakyo, both of Japan

[73] Assignee: Murata Manufacturing Co., Ltd., Kyoto, Japan

[21] Appl. No.: 571,153

[22] Filed: Jan. 18, 1984

Related U.S. Application Data

[63] Continuation of Ser. No. 485,906, Apr. 18, 1983, abandoned, which is a continuation of Ser. No. 299,635, Sep. 4, 1981, abandoned.

[30] Foreign Application Priority Data

Sep. 5, 1980 [JP] Japan ................. 55-123878

[51] Int. Cl.$^3$ ............................................. C04B 35/46
[52] U.S. Cl. ................................................. 252/62.9
[58] Field of Search ..................................... 252/62.9

[56] References Cited

FOREIGN PATENT DOCUMENTS

| | | |
|---|---|---|
| 50-67495 | 6/1975 | Japan ................. 252/62.9 |
| 54-106517 | 8/1979 | Japan ................. 252/62.9 |
| 55-151381 | 11/1980 | Japan ................. 252/62.9 |
| 56-2688 | 1/1981 | Japan ................. 252/62.9 |
| 1104236 | 3/1966 | United Kingdom ...... 252/62.9 |
| 297115 | 11/1969 | U.S.S.R. ............. 252/62.9 |

Primary Examiner—Jack Cooper
Attorney, Agent, or Firm—Birch, Stewart, Kolasch & Birch

[57] ABSTRACT

A piezoelectric ceramic composition comprises a major component,

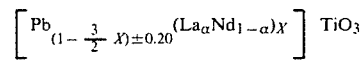

$$\left[ Pb_{(1-\frac{3}{2}X)\pm 0.20}(La_\alpha Nd_{1-\alpha})_X \right] TiO_3$$

(where $0.01 \leq X \leq 0.40$ and $0 \leq \alpha \leq 1$), and CuO contained therein as an additive in an amount of 0.05 to 2.5 wt % with respect to the weight of 1 mole of the major component. If required, this composition may contain 0.05 to 2.0 wt % of $MnO_2$ with respect to the weight of 1 mole of the major component. The composition has excellent temperature characteristics in addition to excellent dielectric and piezoelectric characteristics suitable for use in various fields.

7 Claims, 1 Drawing Figure

PIEZOELECTRIC CERAMIC COMPOSITIONS

This application is a continuation of application Ser. No. 485,906 filed on Apr. 18, 1983, which is a continuation of Ser. No. 299,635 filed on Sept. 4, 1981, both now abandoned.

FIELD OF THE INVENTION

This invention relates to piezoelectric ceramic compositions and, more particularly, to novel piezoelectric ceramic compositions of a lanthanum and/or neodymium modified lead titanate system having excellent dielectric and piezoelectric characteristics suitable for use in various fields.

BACKGROUND OF THE INVENTION

As is known, there are various piezoelectric ceramic compositions such as, for example, those containing $PbTiO_3$ as a major component, or those containing $Pb(Ti, Zr)O_3$ as a major component, or their substitutional solid solutions containing $Pb(Mn_{1/3}Nb_{2/3})O_3$ or $Pb(Ni_{1/3}Nb_{2/3})O_3$ as a second or third component. Among them, the compositions of the binary or ternary system comprising $Pb(Ti, Zr)O_3$ as a major component are improved in piezoelectric characteristics and electrical characteristics by incorporating various additives, and have been used as a material for pyroelectric elements, piezoelectric vibrators, resonators, ceramic filters, surface acoustic wave filters and the like. However, the piezoelectric ceramics with these compositions have essentially a high dielectric constant, so that the devices for high frequencies such as resonators, ceramic filters and surface acoustic wave filters possess extremely low impedance, resulting in the difficulty in matching impedance of the devices with impedance of external circuits.

In contrast therewith, the $PbTiO_3$ ceramics with minor substitution of Pb sites have low dielectric constant. However, they have hardly been put into practical applications because of their poor temperature characteristics.

It is generally known that bulk waves or surface acoustic waves which propagates in or on ceramics being a single phase has a tendency that its propagating rate slows down monotonously with rise of temperature. This reflects on a phenomenon that the ceramics is softened with the rise of its temperature. Considering the influence of this phenomenon upon characteristics of the piezoelectric ceramics, it leads to decrease of the resonant frequency corresponding to the rate of bulk waves or surface acoustic waves with the rise of temperature. Accordingly, in order to produce piezoelectric ceramics of the $PbTiO_3$ system having excellent temperature characteristics without deterioration of other dielectric and piezoelectric characteristics which are enough for practical applications, it is necessary to take a proper step such that the resonant frequency is not considerably decreased with rise of temperature or, conversely, the resonant frequency is increased with rise of temperature. In other words, to keep the propagating rate of bulk waves or surface acoustic waves constant, the ceramics must be so improved that the ceramics do not abruptly soften with the rise of temperature, or that the ceramics harden with the rise of temperature.

SUMMARY OF THE INVENTION

It is therefore an object of the present invention to provide a piezoelectric ceramic composition in which the propagating rate of bulk waves or surface acoustic waves is scarcely decreased or, conversely, increased with rise of temperature.

Another object of the present invention is to provide a piezoelectric ceramic composition with low dielectric constant, high electromechanical coupling coefficient and excellent temperature characteristics.

According to the present invention there is provided a piezoelectric ceramic composition comprising a major component,

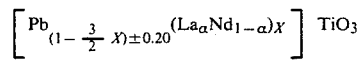

(where $0.01 \leq X \leq 0.40$ and $0 \leq \alpha \leq 1$), and CuO contained as an additive in an amount of 0.05 to 2.5 wt% with respect to the weight of 1 mole of the major component.

If necessary, the above piezoelectric ceramic composition of the present invention may contain $MnO_2$ as the second additive in an amount of 0.05 to 2.0 wt% with respect to the weight of 1 mole of the major component.

In the above composition, while La and Nd are substitutional elements for Pb, either of La or Nd individually contributes to improve the sintering property of the ceramics. For this reason, the value of alpha has been described as being within the range of 0 to 1.

The amount of $(La_\alpha Nd_{1-\alpha})$, or x, has been limited as being within the range of 1 to 40 atom% for the reasons that the substitution less than 1 atom% provides no effect on the improvement in the sintering property and, that the substitution more than 40 atom% results in the deterioration of the piezo-electric characteristics.

Experimentally, it has been found that the amount of Pb in the major component may be deviated within the range of $-20$ to $+20$ atom% from the theoritical amount at which the total valence of cation cites is in proportion to the total valence of anion cites. Such a deviation of the Pb amount causes no disadvantages when the deviation is within the above range. However, the deviation exceding $+20$ atom% results in considerable grain growth, thus making it impossible to produce fine ceramics. The deviation exceding $-20$ atom% results in the formation of a second phase, thereby considerably decreasing the piezoelectricity.

In the above composition, up to 25 atom% of Pb may be replaced by at least one element selected from the group consisting of Ca, Sr, Cd and Ba. The substitution of the above at least one element for Pb makes it possible to produce piezoelectric ceramics having the temperature coefficient of resonant frequency which is approximately equal to zero, because they are negative factors for the resonant frequency.

The reason why the amount of CuO has been limited within the range of 0.05 to 2.5 wt% with respect to the weight of 1 mole of the major component is that, the addition of CuO within this range enables the ceramics to have such a property that they harden or do not abruptly soften with the rise of temperature. In other words, the ceramics is made to have the temperature coefficient of resonant frequency which is not a considerably large negative value, or which is a positive value.

The addition of MnO$_2$ within the range of 0.05 to 2.0 wt% contributes to increasing the electromechanical coupling coefficient (Qm). However, the addition less than 0.05 wt% gives no effects of MnO$_2$ and, the excess more than 2.0 wt% results in decrease of the specific resistance, rendering the ceramics difficult in polarization.

When the above piezoelectric ceramic composition is fired in an oxygen atmosphere containing not less than 80 vol% of oxygen, the amount of fluctuation in specific resistance of the ceramic is considerably decreased since the metal oxides in the composition, for example, Mn is kept in a high valent state resulting from the complete oxidation.

The invention will be further apparent from the following description with reference to examples and the accompanying drawing, in which:

FIG. 1 is a graph showing change in resonant frequency of various ceramics with change in temperature.

EXAMPLES

Compounds PbO(or Pb$_3$O$_4$), TiO$_2$, La$_2$O$_3$, Nd$_2$O$_3$, CuO, MnO$_2$, CaCO$_3$, SrCO$_3$, CdCO$_3$ and BaCO$_3$ are used as raw materials. As raw materials there may be used other compounds of the above elements which finally provide the corresponding oxides in the composition. For example, MnCO$_3$ may be used as a raw material instead of MnO$_2$.

These raw materials are weighed to obtain a mixture comprising a major component

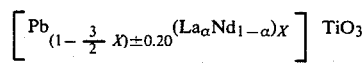

and an additive CuO with or without MnO$_2$ in compositional proportions shown in Table 1, and then mixed in a ball mill by the wet process for about 20 hours. After that, the mixture is dehydrated, dried, and then calcined at 850° to 1100° C. for 2 hours. The resultant calcined body is crushed, milled with a suitable organic binder, then dried and granulated. The thus prepared powder is molded into disks with a diameter of 20 mm and a thickness of 1.5 mm at a pressure of about 1000 kg/cm$^2$.

The disks are sintered at a temperature of 1150° to 1300° C. for 2 hours to provide piezoelectric ceramics. Each plane of the piezoelectric ceramic disks is fitted with a silver electrode by firing, and then polarized in an insulating oil by applying a DC voltage of 2 to 8 Kv/mm for 5 to 10 minutes at 25° to 200° C.

For thus prepared specimens, the dielectric loss (tan δ), dielectric constant (ε), electromechanical coupling coefficient in the radial mode vibration (Kp), mechanical quality factor (Qmp), electromechanical coupling coefficient in the thickness expansion mode vibration (Kt), temperature coefficient of resonant frequency in the radial mode vibration (Cfr.p), temperature coefficient of resonant frequency in the thickness expansion mode vibration (Cfr.t) are measured to evaluate the dielectric characteristics and piezoelectric characteristics. Results are also shown in Table 1.

In Table 1, data for specimens Nos. 12, 16, 19 and 22 are those obtained from the ceramics produced by sintering in oxygen atmospheres respectively containing 95, 80, 99 and 85 vol% of oxygen. Data for specimens which possess no piezoelectric characteristics are tan δ and ε obtained by the measurement before polarization.

TABLE 1

| Specimen No. | x | α | Pb ± 0.20 | Substitutional element in Pb sites (atom %) | CuO (wt %) | MnO$_2$ (wt %) | tanδ (%) | ε | Kp (%) | Qmp | Kt (%) | Cfr.p (ppm/°C.) | Cfr.t (ppm/°C.) |
|---|---|---|---|---|---|---|---|---|---|---|---|---|---|
| 1 | 0.01 | 0.5 | 0 | | 0.05 | — | 0.62 | 179 | 5.1 | 1243 | 47.6 | +3 | +8 |
| 2 | 0.02 | 0.0 | +0.05 | | 0.5 | 0.05 | 0.73 | 186 | 5.5 | 1318 | 49.7 | +27 | +33 |
| 3 | 0.05 | 1.0 | −0.05 | | 2.5 | — | 0.58 | 203 | 6.8 | 1268 | 50.4 | −20 | −24 |
| 4 | 0.10 | 0.2 | 0 | Ba: 25 | 1.0 | 0.1 | 0.61 | 356 | 10.0 | 1774 | 50.9 | −4 | ±0 |
| 5* | 0.10 | 0.7 | −0.10 | | — | — | 1.44 | 273 | 7.5 | 243 | 34.2 | −88 | −95 |
| 6* | 0.12 | 0.0 | +0.15 | | 3.0 | — | 5.03 | 258 | — | — | — | — | — |
| 7* | 0.12 | 1.0 | −0.15 | | — | — | 1.53 | 270 | 8.7 | 211 | 36.6 | −79 | −85 |
| 8 | 0.14 | 0.5 | 0 | Ca: 25 | 0.05 | 1.0 | 0.55 | 493 | 12.1 | 2058 | 54.0 | ±0 | +3 |
| 9* | 0.14 | 0.5 | −0.20 | | 2.5 | 2.5 | 4.15 | 305 | — | — | — | — | — |
| 10* | 0.15 | 0.5 | 0 | | 0.01 | — | 1.77 | 307 | 10.6 | 303 | 35.4 | −90 | −97 |
| 11 | 0.15 | 0.5 | +0.05 | | 1.0 | — | 0.46 | 312 | 13.8 | 2430 | 56.3 | +30 | +38 |
| 12 | 0.15 | 0.5 | +0.05 | Sr: 25 | 1.0 | — | 0.38 | 595 | 14.1 | 2441 | 57.2 | ±0 | +1 |
| 13 | 0.15 | 0.5 | +0.10 | Ca: 10 | 2.5 | — | 0.29 | 386 | 13.4 | 2650 | 58.3 | +3 | +6 |
| 14* | 0.20 | 0.0 | +0.20 | | — | — | 1.36 | 423 | 12.1 | 300 | 37.8 | −75 | −81 |
| 15 | 0.20 | 0.0 | −0.05 | | 0.05 | 0.1 | 0.22 | 448 | 16.5 | 3454 | 57.9 | +40 | +45 |
| 16 | 0.20 | 0.5 | 0 | Cd: 25 | 0.05 | 0.1 | 0.25 | 736 | 15.3 | 3181 | 58.3 | +5 | +7 |
| 17 | 0.20 | 0.5 | 0 | Ca: 5 Ba: 5 | 0.05 | 0.1 | 0.37 | 417 | 15.7 | 3243 | 56.5 | ±0 | +2 |
| 18 | 0.25 | 0.2 | 0 | Ca: 5 Sr: 5 | 0.05 | 0.1 | 0.41 | 506 | 15.4 | 2989 | 54.7 | +4 | +6 |
| 19 | 0.25 | 0.5 | 0 | Cd: 5 Ba: 5 | 0.05 | 0.1 | 0.52 | 538 | 15.0 | 3050 | 55.2 | +7 | +10 |
| 20 | 0.25 | 0.7 | +0.20 | | 0.05 | — | 0.48 | 507 | 14.1 | 2943 | 54.9 | −25 | −30 |
| 21* | 0.30 | 0.0 | 0 | | — | — | 1.47 | 600 | 10.4 | 362 | 34.8 | −94 | −108 |
| 22 | 0.30 | 0.0 | 0 | | 0.1 | 0.01 | 0.61 | 659 | 13.5 | 2431 | 52.7 | +15 | +23 |
| 23 | 0.30 | 1.0 | 0 | | 0.1 | — | 0.73 | 601 | 13.7 | 2252 | 53.0 | −23 | −28 |
| 24* | 0.35 | 0.5 | 0 | | — | — | 1.64 | 1177 | 8.6 | 297 | 32.3 | −105 | −112 |
| 25* | 0.35 | 0.5 | +0.10 | | 0.01 | — | 1.59 | 1154 | 11.4 | 1754 | 48.7 | −97 | −103 |
| 26 | 0.35 | 0.5 | +0.20 | Sr: 2.5 Ba: 2.5 | 0.05 | 2.0 | 1.26 | 1213 | 12.0 | 1831 | 49.1 | ±0 | +2 |
| 27 | 0.40 | 1.0 | 0 | | 2.5 | — | 1.50 | 1755 | 10.0 | 1544 | 45.5 | −30 | −33 |

TABLE 1-continued

| Specimen No. | x | α | Pb ± 0.20 | Substitutional element in Pb sites (atom %) | CuO (wt %) | MnO$_2$ (wt %) | tanδ (%) | ε | Kp (%) | Qmp | Kt (%) | Cfr.p (ppm/°C.) | Cfr.t (ppm/°C.) |
|---|---|---|---|---|---|---|---|---|---|---|---|---|---|
| 28* | 0.40 | 1.0 | +0.05 | | 3.0 | 2.5 | 6.21 | 1934 | — | — | — | — | — |
| 29* | 0.42 | 0.2 | −0.05 | | 0.5 | — | 3.79 | 2623 | — | — | — | — | — |
| 30* | 0.45 | 0.7 | +0.05 | | 0.5 | 2.0 | 4.11 | 2841 | — | — | — | — | — |

The specimen No. 17 was prepared by the following procedures: using the above raw materials other than CuO and MnO$_2$, there are prepared ceramics disks consisting of the major component shown in Table 1 in the same manner as mentioned above, onto which Cu corresponding to 0.05 wt% of CuO and Mn corresponding to 0.1 wt% of MnO$_2$ are adhered by vapour deposition. The disks were then heated for 1 hour at the same temperature for sintering to diffuse CuO and MnO$_2$ thereinto.

Asterisked specimens are compositions beyond the scope of the present invention, whereas other specimens are those within the scope of the present invention.

For specimens Nos. 10, 11 snd 12, the change rate of the resonant frequency in the radial mode vibration were determined with respect to the resonant frequency at the reference temperature of 20° C. The results are plotted as a function of temperature in FIG. 1.

Apart from the above, the specimens Nos. 12, 16, 19 and 22 were respectively prepared by sintering the disks in air and also in an oxygen atmosphere containing 95, 80, 99 or 85 vol% oxygen, respectively. For these specimens the electromechanical coupling coefficient in the thickness expansion mode vibration (Kt) were measured. The amount of fluctuation in Kt for the specimens produced by the oxygen atmosphere sintering is 0.5% in average when expressed by the ratio, (standard deviation/mean value). This value is about ⅓ times of that for the specimens produced by the normal air sintering.

As will be evident from Table 1 and FIG. 1, the compositions acccording to the present invention enable the value of dielectric constant to be controlled in a wide range and, at the same time, the temperature coefficient of resonant requency to be approached to zero or to be changed to a positive value. In other words, according to the present invention, it is possible to produce piezoelectric ceramics with any desired temperature coefficient of resonant frequency by adding the correct amount of CuO. Also, the the replacement of the at least one element of Ca, Sr, Cd and Ba for up to 25 atom% of Pb in the composition enables to improve the temperature coefficient of resonant frequency.

For other piezoelectric characteristics, the piezoelectric ceramics according to the present invention possess the values enough for practical applications so that they can be applied to pyroelectric elements, piezoelectric vibrators, resonators, oscillators, ceramics filters and other devices for high frequencies such as, for example, surface acoustic wace filters.

Provided the amount of La and/or Nd in the composition is in the range of 15 to 40 atom%, its polarization can be carried out under mild conditions, for example, by applying a DC voltage of 2 to 3 Kv/mm for about 5 minutes at a temperature of 25° to 80° C., and these conditions make it possible to use various cheap insulating oil as well as expensive silicon oil for the porization. In addition, the evaporation of PbO in the compositions with the value of X ranging from 0.15 to 0.40 is scarcely taken place during sintering, thus making it possible to produce sufficiently sintered piezoelectric ceramics even when the sintering is carried out in a gas-permeable saggar, for example, of mullite instead of a highly densed alumina saggar. Further, the reaction between the ceramic composition and the saggar material occurs scarcely during sintering so that the saggar stands long use.

While the additives, CuO and MnO$_2$, are mainly used in oxide form in the example, similar effects can be obtained by using Cu and Mn or their compounds. In such a case, metal copper and matal manganese or their compounds are adhered to completely sintered ceramic disks or incompletely sintered ceramic disks by vapour-deposition or coating, and then heat-diffused into ceramic disks by the heat-treatment of the disks.

As many apparently different embodiments of this invention may be made without departing from the spirit and scope thereof, it is to be understood that this invention is not limited to the specific embodiments hereof.

What we claim is:

1. A piezoelectric ceramic composition comprising a major component,

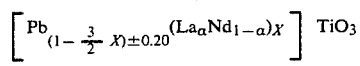

(where $0.01 \leq X \leq 0.40$ and $0 \leq \alpha \leq 1$), and CuO contained therein as an additive in an amount of 0.05 to 2.5 wt% with respect to the weight of 1 mole of the major component, said piezoelectric ceramic composition exhibiting a temperature coefficient of resonant frequency which is either a positive value or a smaller negative value than said composition containing less than 0.05 weight % CuO.

2. The piezoelectric ceramic composition according to claim 1, produced by a sintering presintered body in an oxygen atmosphere containing not less than 80 vol% of oxygen.

3. The piezoelectric ceramic composition according to claim 1, further containing, as an additive, MnO$_2$ in an amount of 0.05 to 2.0 wt% with respect to the weight of 1 mole of the major component.

4. The piezoelectric ceramic composition according to claim 3 wherein up to 25 atom % of Pb in the major component is replaced with at least one element selected from the group consistng of Ca, Sr, Cd and Ba.

5. The piezoelectric ceramic composition according to claim 3, produced by sintering a presintered body in an oxygen atmosphere containing not less than 80 vol% of oxygen.

6. The piezoelectric ceramic composition according to claim 1 wherein up to 25 atom% of Pb in the major component is replaced with at least one element selected from the group consisting of Ca, Sr, Cd and Ba.

7. The piezoelectric ceramic composition according to claim 6, produced by sintering a presintered body in an oxygen atmosphere containing not less than 80 vol% of oxygen.

* * * * *